United States Patent
Patton et al.

(10) Patent No.: US 10,964,514 B2
(45) Date of Patent: Mar. 30, 2021

(54) ELECTRODE FOR PLASMA PROCESSING CHAMBER

(71) Applicant: Lam Research Corporation, Fremont, CA (US)

(72) Inventors: Evan Edward Patton, Pleasanton, CA (US); John Daugherty, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 343 days.

(21) Appl. No.: 15/785,983

(22) Filed: Oct. 17, 2017

(65) Prior Publication Data

US 2019/0115189 A1 Apr. 18, 2019

(51) Int. Cl.
*H01J 37/32* (2006.01)
*H01L 21/3065* (2006.01)
*H01L 21/443* (2006.01)
*H05H 1/46* (2006.01)

(52) U.S. Cl.
CPC ...... *H01J 37/3255* (2013.01); *H01J 37/3244* (2013.01); *H01J 37/32082* (2013.01); *H01J 37/32137* (2013.01); *H01J 37/32183* (2013.01); *H01J 37/32541* (2013.01); *H01J 37/32568* (2013.01); *H01J 37/32577* (2013.01); *H01L 21/3065* (2013.01); *H01L 21/443* (2013.01); *H05H 2001/4645* (2013.01)

(58) Field of Classification Search
CPC .......... H01J 37/32082; H01J 37/32091; H01J 37/321; H01J 37/32458; H01J 37/32467; H01J 37/32477; H01J 37/32486; H01J 37/32495; H01J 37/32504; H01J 37/3255; H01J 37/32137; H01J 37/3244; H01J 37/32183; H01J 37/38082; H01J 37/32577; H01J 37/32541; H01J 21/443; H01J 21/3065; H01J 37/32568; H01J 2001/4645; H01J 37/32559
See application file for complete search history.

(56) References Cited

U.S. PATENT DOCUMENTS

| | | | | |
|---|---|---|---|---|
| 5,074,456 A | * | 12/1991 | Degner | H01J 37/32009 156/345.34 |
| 6,251,216 B1 | * | 6/2001 | Okamura | H01J 37/3244 118/723 E |
| 2002/0123230 A1 | * | 9/2002 | Hubacek | C23C 16/45565 438/712 |

(Continued)

*Primary Examiner* — Rakesh K Dhingra
*Assistant Examiner* — Laureen Chan
(74) *Attorney, Agent, or Firm* — Penilla IP, APC

(57) ABSTRACT

An electrode for transmitting radiofrequency power to a plasma processing region includes a plate formed of semiconducting material and a high electrical conductivity layer formed on a top surface of the plate and integral with the plate. The high electrical conductivity layer has a lower electrical resistance than the semiconducting material of the plate. The electrode includes a distribution of through-holes. Each through-hole extends through an entire thickness of the electrode from a top surface of the high electrical conductivity layer to a bottom surface of the plate. In some embodiments, the plate can be formed of a silicon material and the high electrical conductivity layer can be a silicide material formed from the silicon material of the plate.

23 Claims, 5 Drawing Sheets

(56) References Cited

U.S. PATENT DOCUMENTS

| | | | | |
|---|---|---|---|---|
| 2003/0185729 | A1* | 10/2003 | Ko | H01J 37/32009 422/186.05 |
| 2007/0170156 | A1* | 7/2007 | Hayashi | H01J 37/32009 219/121.45 |
| 2007/0256638 | A1* | 11/2007 | Honda | H01J 37/32091 118/723 E |
| 2009/0015160 | A1* | 1/2009 | Rueger | H01J 9/02 313/582 |
| 2015/0214013 | A1* | 7/2015 | Glukhoy | H01J 37/32449 29/527.1 |

* cited by examiner

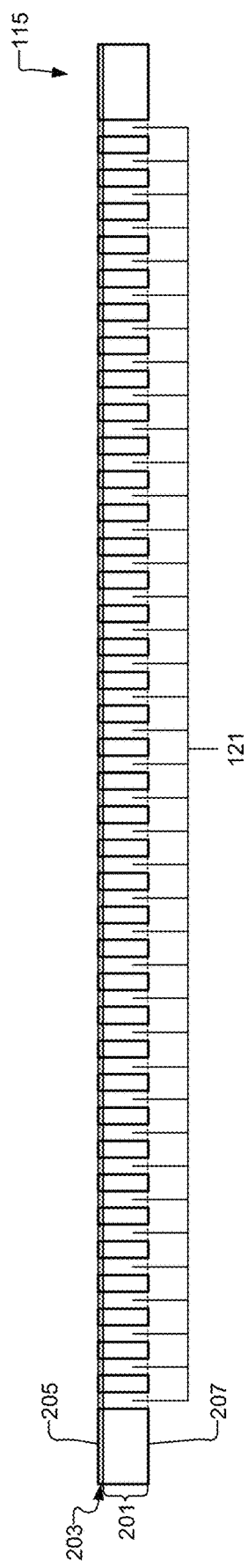

ELECTRODE FOR PLASMA PROCESSING CHAMBER

BACKGROUND

1. Field of the Invention

The present invention relates to semiconductor device fabrication.

2. Description of the Related Art

In various semiconductor fabrication processes, radiofrequency (RF) power is transmitted to a process gas within a processing chamber to generate a plasma. A substrate is exposed to the plasma to produce a desired effect on the substrate. An electrode can be positioned and used within the processing chamber to provide for transmission of RF power to the process gas within a plasma processing region. Also, the electrode can be configured to distribute the process gas to the plasma processing region. The electrode may also be exposed to a region where generation of plasma is undesirable or damaging. It is within this context that the present invention arises.

SUMMARY

In an example embodiment, an electrode for transmitting radiofrequency power to a plasma processing region is disclosed. The electrode includes a plate formed of semiconducting material. The electrode also includes a high electrical conductivity layer formed on a top surface of the plate and integral with the plate. The high electrical conductivity layer has a lower electrical resistance than the semiconducting material of the plate. The electrode includes a distribution of through-holes. Each through-hole extends through an entire thickness of the electrode from a top surface of the high electrical conductivity layer to a bottom surface of the plate.

In an example embodiment, a plasma processing system is disclosed. The system includes a plasma generation chamber including a plasma processing region. The system also includes a substrate support structure disposed within the plasma generation chamber at a location below the plasma processing region. The system also includes an electrode disposed within the plasma generation chamber at a location over the plasma processing region. The system also includes a process gas plenum formed above the electrode. The electrode includes a plate formed of semiconducting material. The electrode also includes a high electrical conductivity layer formed on a top surface of the plate and integral with the plate. The high electrical conductivity layer has a lower electrical resistance than the semiconducting material of the plate. The electrode includes a distribution of through-holes. Each through-hole extends through an entire thickness of the electrode from a top surface of the high electrical conductivity layer to a bottom surface of the plate. The electrode is configured to physically separate the process gas plenum from the plasma processing region and provide for flow of a process gas through the distribution of through-holes from the process gas plenum to the plasma processing region.

In an example embodiment, a method is disclosed for manufacturing an electrode for transmitting radiofrequency power to a plasma processing region. The method includes forming a plate of semiconducting material. The method also includes forming a high electrical conductivity layer on a top surface of the plate and integral with the plate. The high electrical conductivity layer has a lower electrical resistance than the semiconducting material of the plate. The method also includes forming a distribution of through-holes within the plate. Each through-hole is formed to extend from a top surface of the high electrical conductivity layer to a bottom surface of the plate.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 2A shows a vertical cross-section view of the electrode, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In the semiconductor industry, semiconductor substrates can undergo fabrication operations in various types of plasma processing chambers. In some plasma processing chambers, radiofrequency (RF) signals are used to energize a process gas to transform the process gas into a plasma in exposure to the substrate. Reactive species and/or charged species within the plasma are directed to interact with the substrate to modify a condition of the substrate, such as by modifying a material present on the substrate, or depositing material on the substrate, or removing/etching material from the substrate, by way of example. The plasma processing chambers can be equipped with one or more electrodes for transmitting RF power to the process gas to generate the plasma in exposure to the substrate. In some embodiments, the electrode(s) for transmitting the RF power to the process gas can also be configured to separate different volumes from each other within the plasma processing chamber and provide for controlled flow of process gas between different volumes within the plasma processing chamber.

In some embodiments, the substrate as referred to herein is a semiconductor wafer undergoing a fabrication procedure. However, it should be understood that in various embodiments, the substrate can be essentially any type of substrate that is subjected to a plasma-based fabrication process. For example, in some embodiments, the substrate as referred to herein can be a substrate formed of sapphire, GaN, GaAs or SiC, or other substrate materials, and can include glass panels/substrates, metal foils, metal sheets, polymer materials, or the like. Also, in various embodiments, the substrate as referred to herein may vary in form, shape, and/or size. For example, in some embodiments, the substrate referred to herein may correspond to a 200 mm (millimeters) semiconductor wafer, a 300 mm semiconductor wafer, or a 450 mm semiconductor wafer. Also, in some embodiments, the substrate referred to herein may correspond to a non-circular substrate, such as a rectangular substrate for a flat panel display, or the like, among other shapes.

Figure 1:
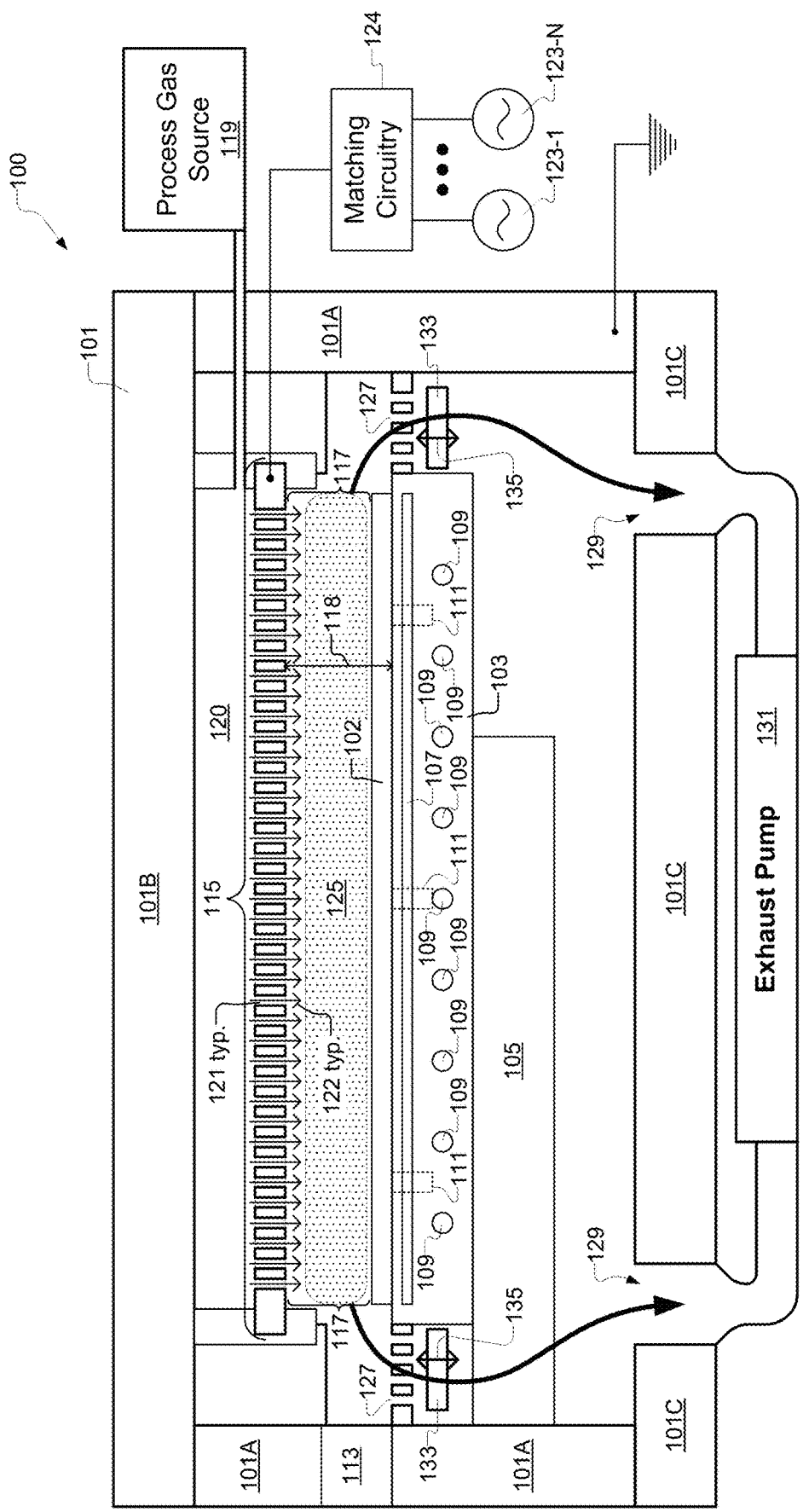
FIG. 1 shows a plasma processing system for substrate plasma processing, in accordance with some embodiments of the present invention.

FIG. 1 shows a plasma processing system 100 for substrate plasma processing, in accordance with some embodiments of the present invention. The plasma processing system 100 includes a plasma generation chamber 101 formed by a surrounding structure 101A, a top structure 101B, and a bottom structure 101C. In various embodiments, the surrounding structure 101A, top structure 101B, and bottom structure 101C can be formed from various materials, such as stainless steel or aluminum, by way of example, so long as the chamber 101 materials are structurally capable of withstanding pressure differentials and temperatures to which they will be exposed during plasma processing, and are chemically compatible with the plasma processing environment.

The plasma processing system 100 also includes a substrate support structure 103 disposed within the plasma generation chamber 101. The substrate support structure 103 is defined to hold a substrate 102 thereon during performance of a plasma processing operation on the substrate 102. In the example embodiment of FIG. 1, the substrate support structure 103 is held by a cantilevered structure 105 affixed to the surrounding structure 101A of the plasma generation chamber 101. However, in other embodiments, the substrate support structure 103 can be affixed to the bottom structure 101C of the plasma generation chamber 101 or to another structure disposed within the plasma generation chamber 101. In various embodiments, the substrate support structure 103 can be formed from various materials, such as stainless steel, aluminum, or ceramic, by way of example, so long as the substrate support structure 103 material is structurally capable of withstanding pressure differentials and temperatures to which it will be exposed during plasma processing, and is chemically compatible with the plasma processing environment.

In some embodiments, the substrate support structure 103 can include a bias electrode 107 for generating an electric field to attract charged constituents of a plasma 125 toward the substrate support structure 103, and thereby toward the substrate 102 held on the substrate support structure 103. Also, in some embodiments, the substrate support structure 103 can include a number of cooling channels 109 through which a cooling fluid can be flowed during plasma processing operations to maintain temperature control of the substrate 102. Also, in some embodiments, the substrate support structure 103 can include a number of lifting pins 111 defined to lift and lower the substrate 102 relative to the substrate support structure 103. In some embodiments, a door assembly 113 is disposed within the surrounding structure 101A of the plasma generation chamber 101 to enable insertion and removal of the substrate 102 into/from the plasma generation chamber 101. Additionally, in some embodiments, the substrate support structure 103 is defined as an electrostatic chuck equipped to generate an electrostatic field for holding the substrate 102 securely on the substrate support structure 103 during plasma processing operations.

The plasma processing system 100 further includes an electrode 115 disposed within the plasma generation chamber 101 above and spaced apart from the substrate support structure 103, so as to be positioned above and spaced apart from the substrate 102 when positioned on the substrate support structure 103. A plasma processing region 117 is formed between the electrode 115 and the substrate support structure 103, and over a horizontal extent of the substrate support structure 103. In some embodiments, a vertical distance 118 as measured between the electrode 115 and the substrate support structure 103, i.e., process gap, is within a range extending from about 1 centimeter (cm) to about 10 cm. In some embodiments, the vertical distance 118 is about 5 cm. In some embodiments, the vertical distance 118 is less than 1 cm. In some embodiments, the vertical distance 118 is greater than 10 cm. Also, in some embodiments, a vertical position of the substrate support structure 103 relative to the electrode 115 is adjustable either during performance of a plasma processing operation or between plasma processing operations. And, in some embodiments, a vertical position of the electrode 115 relative to the substrate support structure 103 is adjustable either during performance of a plasma processing operation or between plasma processing operations.

The plasma processing system 100 further includes a process gas source 119 connected in fluid communication with a process gas plenum 120 formed above the electrode 115 to supply process gas to the process gas plenum 120. The electrode 115 includes a distribution of through-holes 121. To avoid unnecessarily obscuring FIG. 1, one of the multiple through-holes 121 is identified with the reference numeral 121 typ. (typical). The distribution of through-holes 121 is configured to distribute process gas from the process gas plenum 120 to the plasma processing region 117 in a desired pattern. It should be understood that the distribution of through-holes 121 can vary between embodiments with regard to the number of through-holes 121 and the spatial arrangement of the through-holes 121 across the electrode 115. Each through-hole 121 extends through an entire thickness of the electrode 115. In this manner, the electrode 115 is configured to physically separate the process gas plenum 120 from the plasma processing region 117 and provide for flow of a process gas through the distribution of through-holes 121 from the process gas plenum 120 to the plasma processing region 117, as indicated by arrows 122. To avoid unnecessarily obscuring FIG. 1, one of the multiple arrows 122 is identified with the reference numeral 122 typ. (typical).

In the example of FIG. 1, the process gas plenum 120 is formed within the plasma generation chamber 101 above the electrode 115. The process gas plenum 120 is in fluid communication with both the process gas source 119 and the through-holes 121 formed within the electrode 115. In some embodiments, the process gas plenum 120 can be formed to distribute the process gas to each of the through-holes 121 within the electrode 115 in a substantially uniform manner. In other embodiments, the process gas plenum 120 can be formed to distribute the process gas to the through-holes 121 within the electrode 115 in a spatially varying manner, i.e., in a spatially zoned manner.

The plasma processing system 100 also includes one or more RF power sources 123-1 to 123-N in electrical communication with the electrode 115. Each of the plurality of RF power sources 123-1 to 123-N can be independently controllable with regard to RF power frequency and amplitude. Also, RF power is transmitted from each of the RF power sources 123-1 to 123-N through matching circuitry 124 to ensure efficient RF power transmission through the electrode 115 to the plasma 125 load. The matching circuitry 124 includes an arrangement of capacitors and inductors configured to ensure that an impedance seen by the RF power sources 123-1 to 123-N is sufficiently close to a load impedance for which the RF power sources 123-1 to 123-N is/are designed to operate, so that RF signals generated and transmitted by the RF power sources 123-1 to 123-N will be transmitted into the processing region 117 in an efficient manner, e.g., without unacceptable reflection.

During operation of the plasma processing system 100, the process gas supplied by the process gas source 119 enters the process gas plenum 120 and flows through the through-holes 121 within the electrode 115 into the plasma processing region 117 where the process gas is transformed into the plasma 125 by RF power emanating from the electrode 115. The used process gas then flows from the plasma processing region 117 through peripheral vents 127, and is pumped out through exhaust ports 129 by an exhaust pump 131. In some embodiments, a flow throttling device 133 is provided to control a flow rate of the used process gas from the substrate processing region 117. In some embodiments, the flow throttling device 133 is defined as a ring structure that is movable toward and away from the peripheral vents 127, as indicated by arrows 135.

FIG. 2A shows a vertical cross-section view of the electrode 115, in accordance with some embodiments of the present invention. The electrode 115 includes a plate 201 formed of semiconducting material and a high electrical conductivity layer 203 formed on a top surface of the plate 201 and integral with the plate 201. The high electrical conductivity layer 203 has a lower electrical resistance than the semiconducting material of the plate 201. Each through-hole 121 extends through an entire thickness of the electrode 115 from a top surface 205 of the high electrical conductivity layer 203 to a bottom surface 207 of the plate 201. As previously stated, the electrode 115 is configured to physically separate the process gas plenum 120 from the plasma processing region 117 and provide for flow of the process gas through the distribution of through-holes 121 from the process gas plenum 120 to the plasma processing region 117.

Figure 2B:
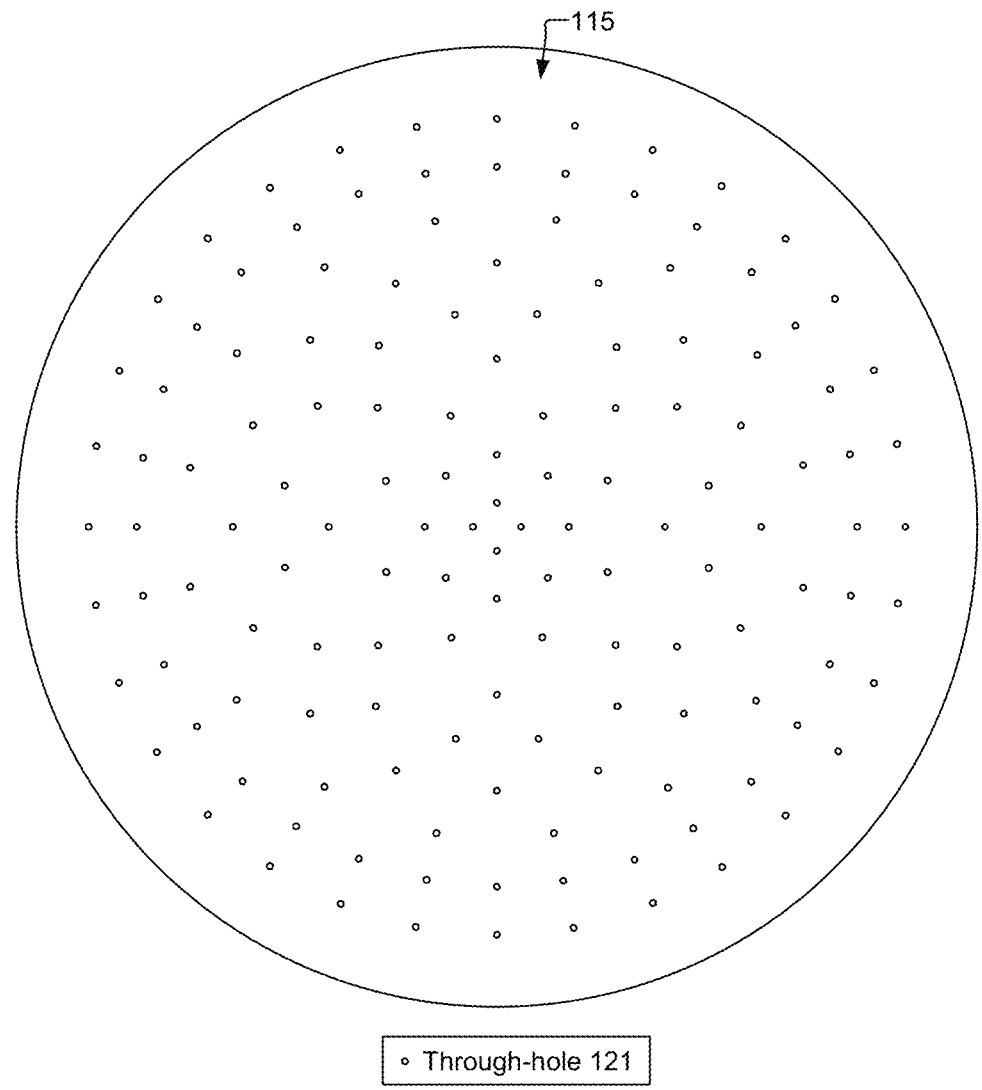
FIG. 2B shows a top view of the electrode, in accordance with some embodiments of the present invention.

FIG. 2B shows a top view of the electrode 115, in accordance with some embodiments of the present invention. FIG. 2B shows an example distribution of through-holes 121. It should be understood that the distribution of through-holes 121 across the electrode 115 can be configured in different ways for different embodiments. For example, a total number of through-holes 121 within the electrode 115 and/or a spatial distribution of through-holes 121 within the electrode 115 can vary between different embodiments. Also, a diameter of the through-holes 121 can vary between different embodiments. In general, it is of interest to reduce the diameter of the through-holes 121 to a size small enough to prevent intrusion of the plasma 125 into the through-holes 121 from the plasma processing region 117. In some embodiments, as the diameter of the through-holes 121 is reduced, the total number of through-holes 121 within the electrode 115 is increased to maintain a prescribed overall flowrate of process gas from the process gas plenum 120 through the electrode 115 to the plasma processing region 117.

In some embodiments, the plate 201 of semiconducting material has a substantially uniform thickness across the radial extent of the electrode 115. However, in other embodiments, the plate 201 of semiconducting material has one or more variations in thickness across the radial extent of the electrode 115. In these embodiments, the high electrical conductivity layer 203 can be formed in a conformal manner over the one or more variations in thickness across the radial extent of the electrode 115. Also, in some embodiments, the high electrical conductivity layer 203 is formed over an entirety of the top surface of the plate 201 of semiconducting material. However, in some embodiments, the high electrical conductivity layer 203 is formed over less than the entirety of the top surface of the plate 201 of semiconducting material. For example, in some embodiments, the high electrical conductivity layer 203 is formed at least over a portion of the top surface of the plate 201 of semiconducting material that is exposed to the process gas plenum 120. Also, in some embodiments, the electrode 115 can be a component within a multiple component electrode assembly. For example, in some embodiments, the electrode 115 can be a inner electrode that is circumscribed by a separate outer electrode within a two-electrode assembly.

Figure 3A:
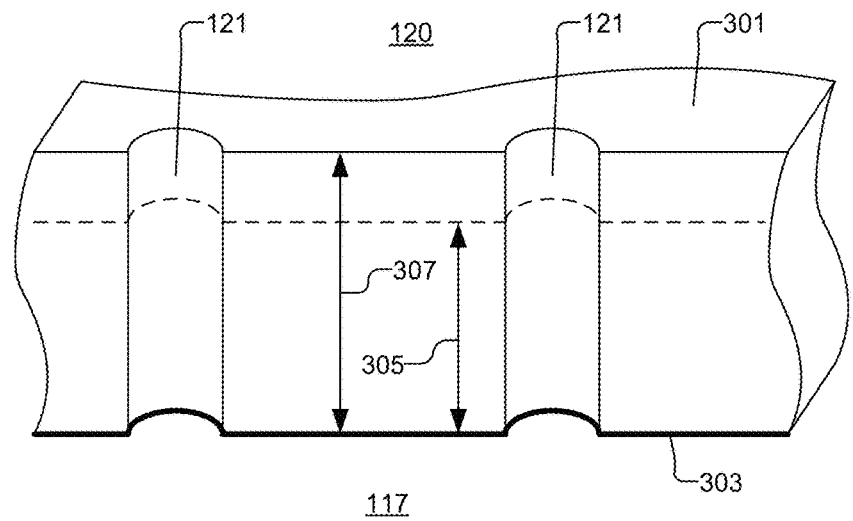
FIG. 3A shows a vertical cross-section through a portion of an example electrode that does not include the high electrical conductivity layer, such as the high electrical conductivity layer included in the electrode as shown in FIG. 2A.

To better appreciate the electrode 115, it should be understood that some electrodes do not include the high electrical conductivity layer 203 as disclosed herein. FIG. 3A shows a vertical cross-section through a portion of an example electrode 301 that does not include the high electrical conductivity layer 203, such as included in the electrode 115 as shown in FIG. 2A. Like the electrode 115, the electrode 301 can be disposed between the plasma processing region 117 and the process gas plenum 120. The electrode 301 has a uniform material composition through its entire vertical thickness. For example, the electrode 301 may be formed of doped silicon and have a substantially uniform material composition through its entire vertical thickness. The electrode 301 can be a silicon electrode doped to a resistivity in a range extending from 0.005 Ohm-cm to 0.020 Ohm-cm. At these resistivity values, an RF skin effect at lower RF frequencies nearly fully penetrates the thickness of the electrode 301. The RF skin effect refers to a portion of the thickness of the electrode 301, as measured from the outer surface of the electrode 301, through which RF signals travel. More specifically, RF signals generally travel along surfaces of electrically conductive materials with some amount of penetration of the RF signals into the electrically conductive material from its surface. In the electrode 301, the RF signals travel toward a reference ground potential below the electrode 301. Therefore, the RF signals travels along a lower surface 303 of the electrode 301 that faces the plasma processing region 117. In this configuration, the RF skin effect corresponds to a distance 305 measured into the electrode 301 from the lower surface 303 of the electrode 301. As shown in the example of FIG. 3A, an overall thickness 307 of the electrode 301 is large enough so that the RF skin effect does not extend through the entire thickness of the electrode 301 and into the process gas plenum 120.

Figure 3B:
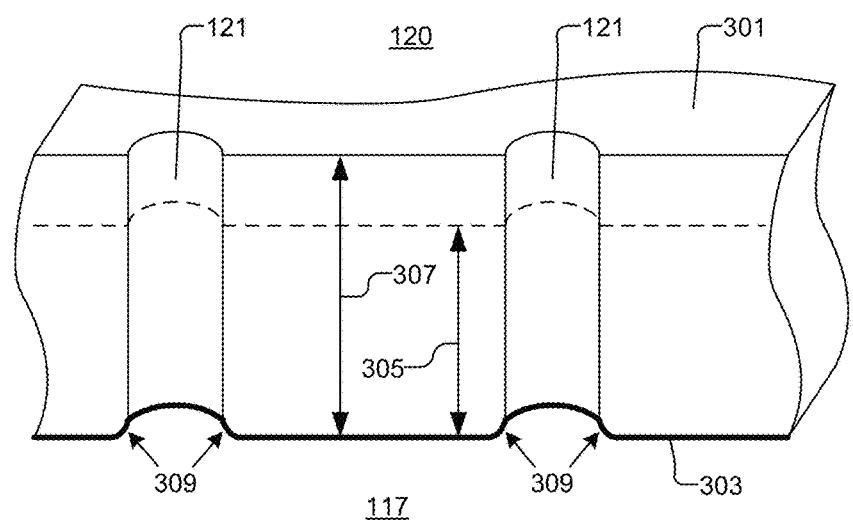
FIG. 3B shows the electrode of FIG. 3A with the lower surface rounded/chamfered at the through-hole locations.

There are drawbacks, however, to having electrodes of large overall thickness 307. One drawback is expense. Because the electrode 301 is formed of expensive material, such a doped silicon material in some cases, an increased overall thickness 307 of the electrode 301 directly corresponds to increased expense. Also, a primary failure mode of the electrode 301 formed of silicon material is that with increased exposure of the lower surface 303 of the electrode 301 to the plasma 125 within the plasma processing region 117, the lower surface 303 of the electrode 301 will become rounded/chamfered at the through-hole 121 locations. FIG. 3B shows the electrode 301 with the lower surface 303 rounded/chamfered at the through-hole 121 locations. This rounding/chamfering of the lower surface 303 at the through-hole 121 locations causes a geometry of the through-holes 121 to get out of specified dimensional ranges, which can in turn cause variation/drift in plasma processing of the substrate. When this happens, the electrode 301 has to be replaced.

Another drawback to having electrodes of large overall thickness 307 is that it becomes more difficult to manufacture the through-holes 121 of smaller diameter. It is necessary to prevent the plasma 125 from going up into the through-holes 121 past the lower surface 303 of the electrode 301 that faces the plasma processing region 117. Also, smaller diameter through-holes 121 are needed to prevent hollow cathode discharge in the through-holes 121 during plasma processes that utilize higher bias voltages, such as plasma processes used for leading-edge 3-D memory fabrication. It should be appreciated that as device nodes get smaller, an etched region aspect ratio (i.e., ratio of etched region depth to etched region width) can become large, which requires use of higher bias voltage to draw the etch front down into the deeper etched region. Use of higher bias voltage, however, increases the likelihood that the plasma 125 will go up into the through-holes 121 in the electrode 301, which can cause particles and other process issues. Therefore, it is desirable to have an increased number of smaller diameter through-holes 121 in the electrode 301 to prevent intrusion of the plasma 125 into the through-holes.

Additionally, a reduction in the diameter of the through-holes 121 is limited by the overall thickness 307 of the electrode 301. For example, if the through-holes 121 are formed by drilling through the electrode 301, when the diameter of the through-holes 121 becomes too small relative to the overall thickness 307 of the electrode 301, it becomes difficult, if not impossible, to drill the through-holes 121 completely through the electrode 301 without breaking the drill bit. Also, when the drill bit breaks, there is a high probability of damage occurring to the electrode 301. Therefore, it should be understood that with a larger overall thickness 307 of the electrode 301, it is more difficult to form through-holes 121 of smaller diameter within the electrode 301. And, conversely, with a smaller overall thickness 307 of the electrode 301, it is easier to form through-holes 121 of smaller diameter within the electrode 301.

Figure 3C:
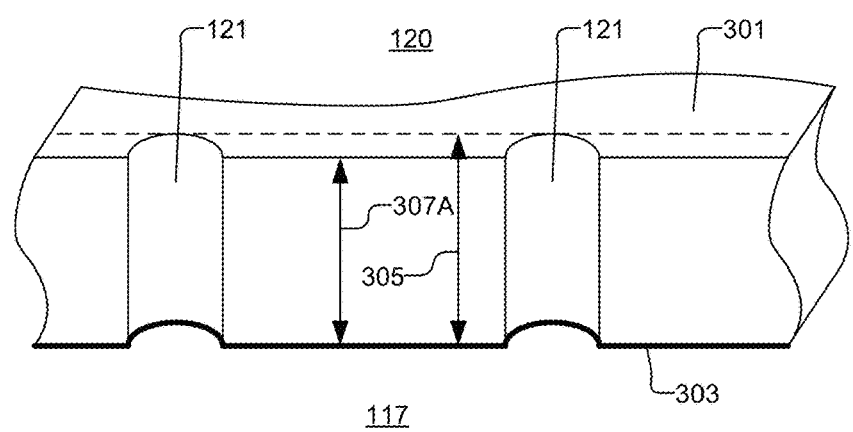
FIG. 3C shows the electrode of FIG. 3A with a reduced overall thickness that is less than the distance corresponding to the RF skin effect, such that the RF signals traveling on the lower surface of the electrode will adversely extend into the process gas plenum.

Given the foregoing, it is desirable to make the electrode 301 thinner to both reduce cost and enable formation of through-holes 121 of smaller diameter. However, when the overall thickness 307 of the electrode 301 is reduced too much, the RF skin effect will exceed the overall thickness 307 of the electrode 301. More specifically, with RF signal frequencies of up to 60 megaHertz, the RF skin effect can become larger than the overall thickness 307 of the electrode 301 such that the RF traveling on the lower surface 303 of the electrode 301 will extend into the process gas plenum 120 overlying the electrode 301. FIG. 3C shows the electrode 301 with a reduced overall thickness 307A that is less than the distance 305 corresponding to the RF skin effect, such that the RF signals traveling on the lower surface 303 of the electrode 301 will adversely extend into the process gas plenum 120. It is necessary that the RF be contained within the body of the electrode 301, because it is not acceptable for the process gas to be energized in the process gas plenum 120 overlying the electrode 301. Therefore, with the electrode 301 of uniform material composition, the overall thickness 307 of the electrode 301 cannot simply be reduced in the interest of forming through-holes 121 of smaller diameter and/or reducing electrode 301 cost without unacceptably increasing the likelihood that the process gas within the process gas plenum 120 will be exposed to RF traveling on the lower surface 303 of the electrode 301 by way of the RF skin effect.

Figure 4:
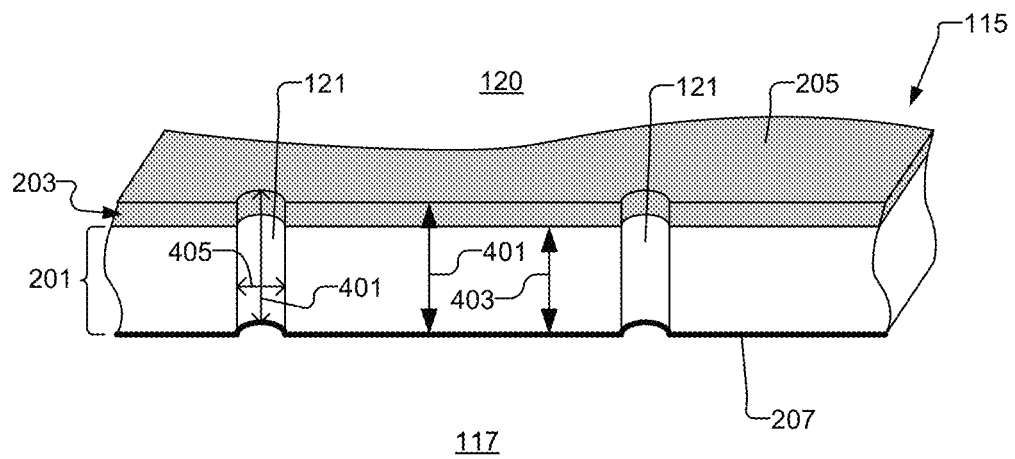
FIG. 4 shows a vertical cross-section through a portion of the electrode of FIG. 2A, in accordance with some embodiments of the present invention.

FIG. 4 shows a vertical cross-section through a portion of the electrode 115, in accordance with some embodiments of the present invention. It should be understood and appreciated that the high electrical conductivity layer 203 of the electrode 115 serves as a barrier to the RF skin effect. In this manner, the RF extension into the body of the electrode 115 from the lower surface 207 is limited to a distance 403 as measured from the lower surface 207 to the high electrical conductivity layer 203. Therefore, when an overall thickness 401 of the electrode 115 is less than the distance corresponding to the RF skin effect, the high electrical conductivity layer 203 prevents RF signals from extending into the process gas plenum 120 overlying the electrode 115. With the high electrical conductivity layer 203, an extent of reduction in the overall thickness 401 of the electrode 115 is limited primarily by the mechanical properties of the electrode 115 and is not limited by manufacturability of the through-holes 121. More specifically, the overall thickness 401 of the electrode 115 can be reduced so long as the electrode 115 is mechanically capable of supporting itself and withstanding pressure differentials that may occur between the process gas plenum 120 and the plasma processing region 117. Also, it should be understood and appreciated that as the overall thickness 401 of the electrode 115 is reduced, a diameter 405 of the through-holes 121 can be substantially reduced without jeopardizing manufacturability of the through-holes 121 and/or integrity of the electrode 115. By reducing the diameter 405 of the through-holes 121, prevention of plasma 125 intrusion into the through-holes 121 is improved and the potential for hollow cathode light-up within the through-holes 121 is reduced. Also, as the diameter 405 of the through-holes 121 is reduced, the overall number of through-holes 121 can be increased to provide a required cumulative flow rate of process gas through the electrode 115.

In some embodiments, the plate 201 of the electrode 115 is formed of a silicon material. The silicon material can be doped with charge carriers to modify its electrical conductivity. In some embodiments, the plate 201 of the electrode 115 is formed of monocrystalline silicon with the through-holes 121 formed through the plate 201. The monocrystalline silicon can be doped with charge carriers to modify its electrical conductivity. In some embodiments, the plate 201 of the electrode 115 is formed of polycrystalline silicon with the through-holes 121 formed through the plate 201. The polycrystalline silicon can be doped with charge carriers to modify its electrical conductivity. In some embodiments, the plate 201 of the electrode 115 is formed of porous silicon material with the through-holes 121 formed through the plate 201. In some embodiments, the plate 201 of the electrode 115 is formed of porous silicon material without the through-holes 121 formed through the plate 201, and with the porosity of the porous silicon material providing for flow of the process gas from the process gas plenum 120 to the plasma processing region 117. The porous silicon material can be doped with charge carriers to modify its electrical conductivity.

In some embodiments, with the plate 201 of the electrode 115 formed of a silicon material, the high electrical conductivity layer 203 is a silicide material formed from the silicon material of the plate 201. The silicide material of the high electrical conductivity layer 203 has a lower electrical resistance than the semiconducting material of the plate 201. By forming the high electrical conductivity layer 203 as silicide on the plate 201 of silicon material, the electrical resistivity of the high electrical conductivity layer 203 can be reduced by 1 to 2 orders of magnitude relative to the electrical resistivity of the plate 201, which provides for reduction in the overall thickness 401 of the electrode 115 while fully confining the RF skin effect within the electrode 115. In some embodiments, the silicide material of the high electrical conductivity layer 203 is defined so as to not form a volatile etch byproduct in exposure to a fluorine-containing process gas. In some embodiments, the silicide material of the high electrical conductivity layer 203 is one or more of titanium silicide, molybdenum silicide, tungsten silicide, and nickel silicide. It should be understood, however, that in other embodiments, with the plate 201 formed of silicon material, the high electrical conductivity layer 203 can be essentially any type of silicide material that provides sufficiently high electrical conductivity and that is chemically compatible with the process gas and plasma processing environment to which it is exposed.

It should be understood that the high electrical conductivity layer 203 formed as silicide material acts as a stop layer for the RF signals, thereby confining the RF skin effect within the electrode 115. With the high electrical conductivity layer 203 formed as silicide material, a thickness of silicide material is defined to ensure that silicide material acts as a stop layer for the RF signals. In some embodiments, the thickness of the high electrical conductivity layer 203 formed as silicide material is within a range extending from about 1000 angstroms to about 2000 angstroms. However, in some embodiments, the thickness of the high electrical conductivity layer 203 formed as silicide material is either less than about 1000 angstroms, or greater than about 2000 angstroms. In some embodiments, to form the high electrical conductivity layer 203 as silicide material, the silicide material is formed on the plate 201 before the through-holes 121 are formed through the electrode 115. Alternatively, in some embodiments, to form the high electrical conductivity layer 203 as silicide material, the silicide material is formed on the plate 201 after the through-holes 121 are formed through the plate 201. Also, it should be understood that formation of the high electrical conductivity layer 203 as silicide material can be done using essentially any available silicide forming process, such as box coater, salicide, co-deposit, and reactive sputter, among others. Silicidation is a well-known, relatively low-cost operation that integrates well with silicon electrode 115 manufacturing.

In some embodiments, with the high electrical conductivity layer 203 formed on the top of the electrode 115, the entire thickness 401 of the electrode 115 from the top surface 205 of the high electrical conductivity layer 203 to the bottom surface 207 of the plate 201 is within a range extending from about 0.1 inch to about 0.75 inch, or within a range extending from about 0.1 inch to about 0.5 inch, or within a range extending from about 0.25 inch to about 0.75 inch, or within a range extending from about 0.5 inch to about 0.75 inch, or about 0.25 inch, or about 0.5 inch, or about 0.6 inch. In other embodiments, with the high electrical conductivity layer 203 formed on the top of the electrode 115, the entire thickness 401 of the electrode 115 from the top surface 205 of the high electrical conductivity layer 203 to the bottom surface 207 of the plate 201 can be less than about 0.1 inch, or can be greater than about 0.75 inch. Also, in some embodiments, with the high electrical conductivity layer 203 formed on the top of the electrode 115, the diameter 405 of the through-holes 121 is within a range extending from about 0.005 inch to about 0.02 inch, or within a range extending from about 0.005 inch to about 0.009 inch, or within a range extending from about 0.005 inch to about 0.007 inch, or about 0.017 inch, or about 0.007 inch. In other embodiments, with the high electrical conductivity layer 203 formed on the top of the electrode 115, the diameter 405 of the through-holes 121 can be less than about 0.005 inch, or greater than about 0.02 inch.

Figure 5:
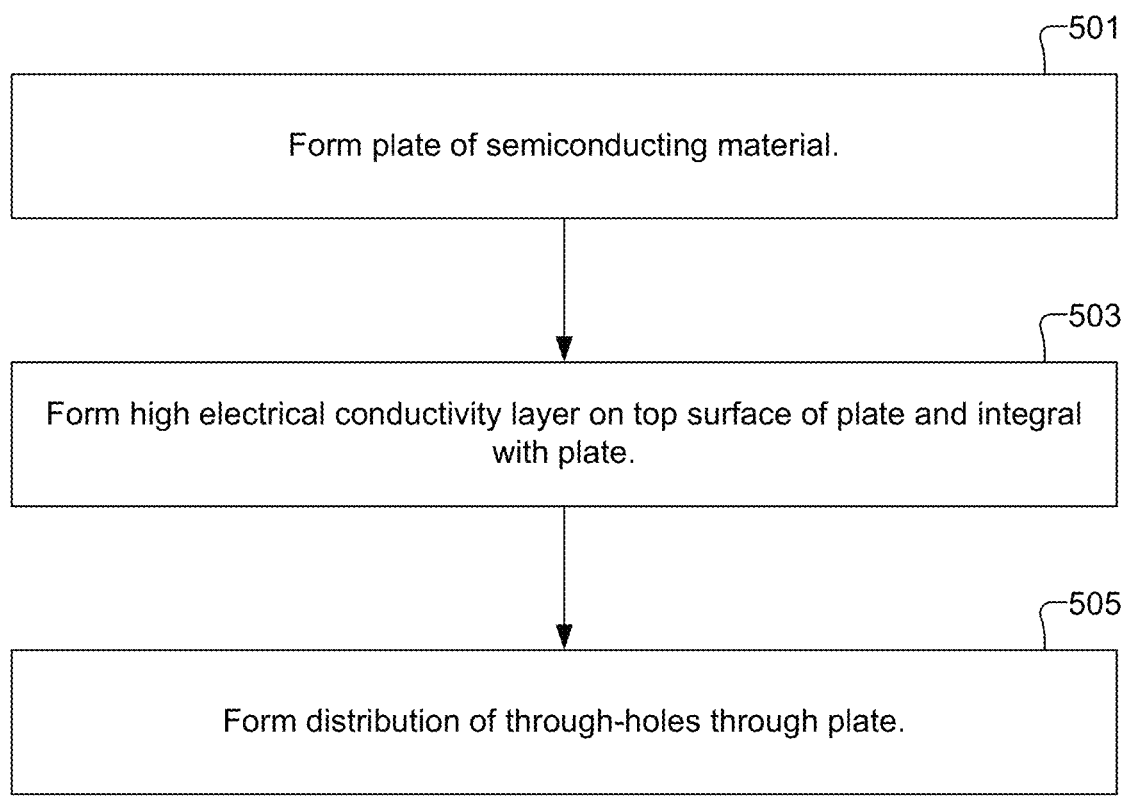
FIG. 5 shows a flowchart of a method for manufacturing the electrode of FIG. 2A for transmitting RF power to the plasma processing region, in accordance with some embodiments of the present invention.

FIG. 5 shows a flowchart of a method for manufacturing the electrode 115 for transmitting RF power to the plasma processing region 117, in accordance with some embodiments of the present invention. The method includes an operation 501 for forming the plate 201 of semiconducting material. In some embodiments, the plate 201 is formed for a silicon material, such as monocrystalline silicon, polycrystalline silicon, or porous silicon. In some embodiments, the plate 201 of semiconducting material can be doped with charge carriers to obtain a prescribed electrical conductivity within the plate 201. The method also includes an operation 503 for forming a high electrical conductivity layer 203 on a top surface of the plate 201 and integral with the plate 201. The high electrical conductivity layer 203 has a lower electrical resistance than the semiconducting material of the plate 201. In some embodiments, the plate 201 is formed of silicon material and the high electrical conductivity layer 203 is a silicide material formed from the silicon material of the plate 201. The method also includes an operation 505 for forming the distribution of through-holes 121 through the plate 201. Each through-hole 121 is formed to extend from the top surface 205 of the high electrical conductivity layer 203 to the bottom surface 207 of the plate 201. In some embodiments, the operation 505 is performed after the operation 503. In some embodiments, the operation 505 is performed before the operation 503.

It should be appreciated that use of silicide as the high electrical conductivity layer 203 on the top of the electrode 115 (formed of silicon material) serves to increase the electrical conductivity at the top of the electrode 115, thereby enabling reduction in the overall thickness 401 of the electrode 115. This reduction in the overall thickness 401 of the electrode 115 improves manufacturability of through-holes 121 of smaller diameter 405 so as to reduce/eliminate through-hole 121 "light up" (hollow cathode discharge), and also reduces the amount of silicon material used to form the electrode 115 which corresponds to a reduction in cost of the electrode 115. Further, for leading edge dielectric etching processes, reduction in silicon electrode 115 cost is a significant consideration. Also, high quality silicon electrode 115 capacity/availability will likely be a significant consideration as consumption increases, thereby presenting an electrode 115 production challenge in order to meet industry demand. It should be appreciated that the reduction in overall thickness 401 of the electrode 115 as afforded by the high electrical conductivity layer 203 provides for a faster production rate of the electrode 115 to help satisfy the expected increase in industry demand.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. An electrode for transmitting radiofrequency power to a plasma processing region, comprising:
a plate formed of a silicon material as a bottom layer, and the plate having a top layer of a silicide material formed on a top surface of the silicon material, the top layer of the silicide material having a lower electrical resistance than the bottom layer of the silicon material, the bottom layer of the silicon material having a thickness that is less than a radiofrequency signal skin effect distance within the silicon material, the top layer of the silicide material having a thickness within a range extending from about 1000 angstroms to about 2000 angstroms, the bottom layer of the silicon material configured for exposure to the plasma processing region,
the plate including a distribution of through-holes, each through-hole extending through an entire thickness of the plate.

2. The electrode as recited in claim 1, wherein the electrode is configured to physically separate a process gas plenum from a plasma processing region and provide for flow of a process gas through the distribution of through-holes from the process gas plenum to the plasma processing region.

3. The electrode as recited in claim 1, wherein the silicon material is either monocrystalline silicon or polycrystalline silicon.

4. The electrode as recited in claim 1, wherein the silicide material does not form a volatile etch byproduct in exposure to a fluorine-containing process gas.

5. The electrode as recited in claim 1, wherein the silicide material is one or more of titanium silicide, molybdenum silicide, tungsten silicide, and nickel silicide.

6. The electrode as recited in claim 1, wherein the entire thickness of the plate is within a range extending from about 0.1 inch to about 0.75 inch.

7. The electrode as recited in claim 1, wherein a diameter of each through-hole is within a range extending from about 0.005 inch to about 0.02 inch.

8. A plasma processing system, comprising:
a plasma generation chamber including a plasma processing region;
a substrate support structure disposed within the plasma generation chamber at a location below the plasma processing region;
a process gas plenum;
an electrode disposed within the plasma generation chamber, the electrode configured to physically separate the process gas plenum from the plasma processing region, the electrode including a plate formed of a silicon material as a bottom layer, and the plate having a top layer of a silicide material formed on a top surface of the silicon material, the top layer of the silicide material having a lower electrical resistance than the bottom layer of the silicon material, the plate including a distribution of through-holes, each through-hole extending through an entire thickness of the Plate, the electrode configured to provide for flow of a process gas through the distribution of through-holes from the process gas plenum to the plasma processing region, a top surface of the top layer of the silicide material exposed to the process gas plenum, a bottom surface of the bottom layer of the silicon material exposed to the plasma processing region, the bottom layer of the silicon material having a thickness that is less than a radiofrequency signal skin effect distance within the silicon material, the top layer of the silicide material having a thickness within a range extending from about 1000 angstroms to about 2000 angstroms; and
radiofrequency power supply connected to supply radiofrequency power to the plate of the electrode.

9. The plasma processing system as recited in claim 8, further comprising:
matching circuitry connected to an output of the radiofrequency power supply, the radiofrequency power supply in electrical communication with the plate of the electrode through the matching circuitry.

10. The plasma processing system as recited in claim 8, wherein the entire thickness of the plate is within a range extending from about 0.1 inch to about 0.75 inch.

11. The plasma processing system as recited in claim 8, wherein a diameter of each through-hole is within a range extending from about 0.005 inch to about 0.02 inch.

12. A method for manufacturing an electrode for transmitting radiofrequency power to a plasma processing region, comprising:
forming a plate of a silicon material, the plate having a thickness less than a radiofrequency signal skin effect distance associated with radiofrequency signals applied to the plate of the silicon material for transmission to the plasma processing region;
forming a layer of a silicide material on a top surface of the plate from the silicon material of the plate, the layer of silicide material having a lower electrical resistance than the silicon material of the plate, the layer of the silicide material having a thickness within a range extending from about 1000 angstroms to about 2000 angstroms; and forming a distribution of through-holes through the plate, each through-hole formed to extend through an entire thickness of the plate that includes the layer of the silicide material.

13. The method as recited in claim 12, wherein the entire thickness of the plate is within a range extending from about 0.1 inch to about 0.75 inch.

14. The method as recited in claim 12, wherein a diameter of each through-hole is within a range extending from about 0.005 inch to about 0.02 inch.

15. The method as recited in claim 12, wherein a diameter of each through-hole is within a range extending from about 0.005 inch to about 0.009 inch.

16. The method as recited in claim 12, wherein a diameter of each through-hole is within a range extending from about 0.005 inch to about 0.007 inch.

17. The method as recited in claim 12, wherein the silicide material has an electrical resistivity at least one order of magnitude lower than an electrical resistivity of the silicon material.

18. The electrode as recited in claim 1, wherein a diameter of each through-hole is within a range extending from about 0.005 inch to about 0.009 inch.

19. The electrode as recited in claim 1, wherein a diameter of each through-hole is within a range extending from about 0.005 inch to about 0.007 inch.

20. The electrode as recited in claim 1, wherein the silicide material has an electrical resistivity at least one order of magnitude lower than an electrical resistivity of the silicon material.

21. The plasma processing system as recited in claim 8, wherein a diameter of each through-hole is within a range extending from about 0.005 inch to about 0.009 inch.

22. The plasma processing system as recited in claim 8, wherein a diameter of each through-hole is within a range extending from about 0.005 inch to about 0.007 inch.

23. The plasma processing system as recited in claim 8, wherein the top layer of the silicide material of the plate has an electrical resistivity at least one order of magnitude lower than an electrical resistivity of the bottom layer of the silicon material of the plate.

\* \* \* \* \*